United States Patent
Okano et al.

(10) Patent No.: US 8,008,967 B2
(45) Date of Patent: Aug. 30, 2011

(54) POWER SUPPLY VOLTAGE ADJUSTING DEVICE

(75) Inventors: Hiroshi Okano, Kawasaki (JP); Atsuki Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/051,788

(22) Filed: Mar. 19, 2008

(65) Prior Publication Data

US 2008/0191681 A1     Aug. 14, 2008

Related U.S. Application Data

(63) Continuation of application No. PCT/JP2005/017312, filed on Sep. 20, 2005.

(51) Int. Cl.
*G05F 1/10*  (2006.01)
*G05F 3/02*  (2006.01)

(52) U.S. Cl. .................... 327/544; 327/530

(58) Field of Classification Search ............ 327/156, 327/158, 161, 544, 530
See application file for complete search history.

(56) References Cited

U.S. PATENT DOCUMENTS

| | | | |
|---|---|---|---|
| 6,049,221 A | | 4/2000 | Ishibashi et al. |
| 6,114,888 A | * | 9/2000 | Walley .................. 327/157 |
| 6,154,100 A | * | 11/2000 | Okamoto .................. 331/57 |
| 6,504,407 B2 | * | 1/2003 | Park et al. .................. 327/115 |
| 6,657,467 B2 | | 12/2003 | Seki et al. |
| 6,667,651 B2 | * | 12/2003 | Hashiguchi ............. 327/538 |
| 6,853,177 B2 | | 2/2005 | Shibayama et al. |
| 6,924,679 B2 | * | 8/2005 | Seno et al. .................. 327/158 |
| 6,930,521 B2 | * | 8/2005 | Wald .................. 327/147 |
| 6,956,416 B2 | * | 10/2005 | Wilson et al. .................. 327/156 |
| 2003/0197547 A1 | | 10/2003 | Mizuno et al. |
| 2005/0062507 A1 | * | 3/2005 | Naffziger et al. ............. 327/105 |
| 2005/0116765 A1 | | 6/2005 | Sakiyama et al. |
| 2006/0076989 A1 | * | 4/2006 | Culmer .................. 327/156 |
| 2006/0176092 A1 | * | 8/2006 | Taniguchi .................. 327/158 |

FOREIGN PATENT DOCUMENTS

| | | |
|---|---|---|
| JP | 03-038862 A | 2/1991 |
| JP | 8-274620 A | 10/1996 |
| JP | 11-31960 A | 2/1999 |
| JP | 2000-133772 A | 5/2000 |
| JP | 2000-216337 A | 8/2000 |
| JP | 2000-268019 A | 9/2000 |
| JP | 2002-359289 A | 12/2002 |
| JP | 3478284 B2 | 12/2003 |
| JP | 2004-146612 A | 5/2004 |
| JP | 2005-73494 A | 3/2005 |
| JP | 2005-166698 A | 6/2005 |

\* cited by examiner

*Primary Examiner* — Quan Tra
(74) *Attorney, Agent, or Firm* — Fujitsu Patent Center

(57) ABSTRACT

In a semiconductor integrated circuit including plural types of transistors having different threshold voltages, a plurality of oscillators including respective types of transistors are provided. The respective oscillation frequencies of these oscillators are counted, and based on the count values, a voltage to be set on a power supply voltage device for the semiconductor integrated circuit is determined according to the count values.

10 Claims, 21 Drawing Sheets

F I G. 4

LOW-Vth TRANSISTOR OSCILLATOR

| OSCILLATION FREQUENCY CODE [13:7] | PROCESS VARIANCE CODE [5:3] |
|---|---|
| 127 ~ 80 | 7 |
| 79 ~ 76 | 6 |
| 75 ~ 72 | 5 |
| 71 ~ 68 | 4 |
| 67 ~ 65 | 3 |
| 64 ~ 62 | 2 |
| 61 ~ 60 | 1 |
| 59 ~ 0 | 0 |

HIGH-Vth TRANSISTOR OSCILLATOR

| OSCILLATION FREQUENCY CODE [6:0] | PROCESS VARIANCE CODE [2:0] |
|---|---|
| 127 ~ 68 | 7 |
| 67 ~ 64 | 6 |
| 63 ~ 61 | 5 |
| 60 ~ 58 | 4 |
| 57 ~ 55 | 3 |
| 54 ~ 52 | 2 |
| 51 ~ 50 | 1 |
| 49 ~ 0 | 0 |

FIG. 5

| VOLTAGE CODE | PROCESS VARIANCE CODE [2:0] | | | | | | | |
|---|---|---|---|---|---|---|---|---|
| | 7 | 6 | 5 | 4 | 3 | 2 | 1 | 0 |
| 7 | 0100 | 0100 | 0100 | 0100 | 0100 | 0100 | 0100 | 0100 |
| 6 | 0100 | 0100 | 0101 | 0101 | 0110 | 0110 | 0110 | 0111 |
| 5 | 0101 | 0110 | 0110 | 0111 | 0111 | 1000 | 0111 | 1001 |
| 4 | 0110 | 0111 | 0111 | 1000 | 1000 | 1001 | 1010 | 1011 |
| 3 | 0111 | 1000 | 1000 | 1001 | 1010 | 1011 | 1011 | 1100 |
| 2 | 1000 | 1000 | 1001 | 1010 | 1011 | 1100 | 1101 | 1101 |
| 1 | 1000 | 1001 | 1010 | 1011 | 1100 | 1101 | 1110 | 1110 |
| 0 | 1001 | 1010 | 1011 | 1011 | 1100 | 1110 | 1110 | 1111 |

PROCESS VARIANCE CODE [5:3]

| VOLTAGE CODE [3:0] | SET VOLTAGE [V] |
|---|---|
| 0000 | 1.000 |
| 0001 | 1.025 |
| 0010 | 1.050 |
| 0011 | 1.075 |
| 0100 | 1.100 |
| 0101 | 1.125 |
| 0110 | 1.150 |
| 0111 | 1.175 |
| 1000 | 1.200 |
| 1001 | 1.225 |
| 1010 | 1.250 |
| 1011 | 1.275 |
| 1100 | 1.300 |
| 1101 | 1.325 |
| 1110 | 1.350 |
| 1111 | 1.375 |

F I G. 6

LOW-Vth TRANSISTOR OSCILLATOR

| OSCILLATION FREQUENCY CODE [13:7] | | | PROCESS VARIANCE CODE [5:3] |
|---|---|---|---|
| 80[°C] | 40[°C] | 0[°C] | |
| 127～80 | 127～84 | 127～89 | 7 |
| 79～76 | 83～80 | 88～85 | 6 |
| 75～72 | 79～76 | 84～80 | 5 |
| 71～68 | 75～72 | 79～76 | 4 |
| 67～65 | 71～69 | 75～73 | 3 |
| 64～62 | 68～66 | 72～69 | 2 |
| 61～60 | 65～63 | 68～67 | 1 |
| 59～0 | 62～0 | 66～0 | 0 |

HIGH-Vth TRANSISTOR OSCILLATOR

| OSCILLATION FREQUENCY CODE [6:0] | | | PROCESS VARIANCE CODE [2:0] |
|---|---|---|---|
| 80[°C] | 40[°C] | 0[°C] | |
| 127～68 | 127～71 | 127～75 | 7 |
| 67～64 | 70～67 | 74～70 | 6 |
| 63～61 | 66～63 | 69～66 | 5 |
| 60～58 | 62～60 | 65～63 | 4 |
| 57～55 | 59～57 | 62～60 | 3 |
| 54～52 | 56～55 | 59～57 | 2 |
| 51～50 | 54～53 | 56～55 | 1 |
| 49～0 | 52～0 | 54～0 | 0 |

FIG. 7

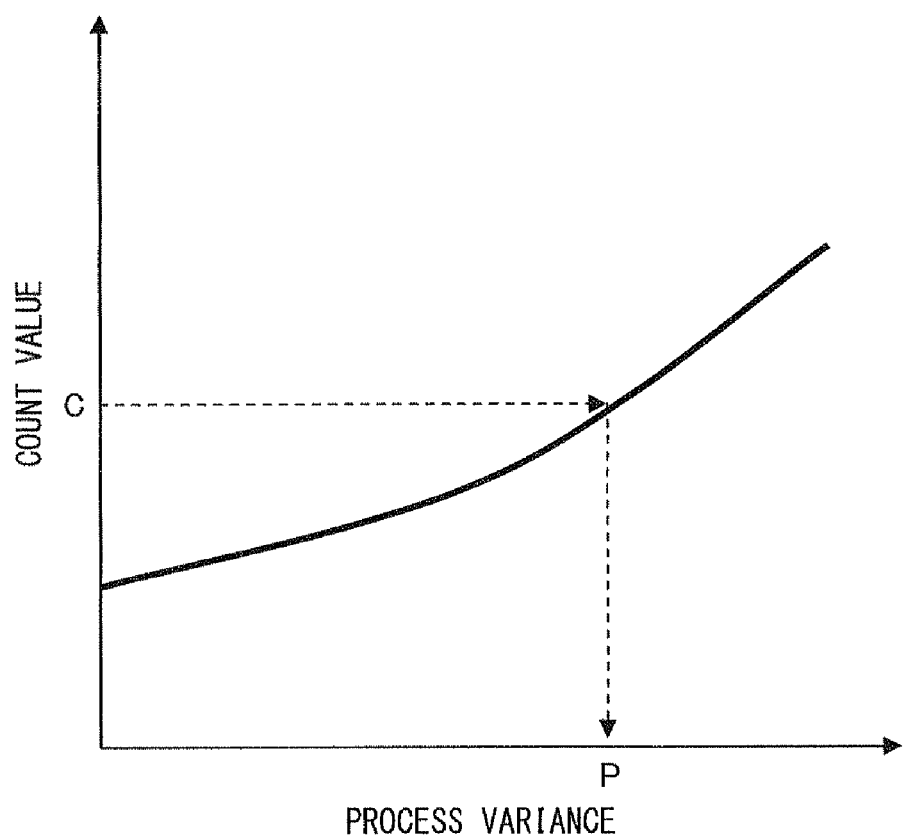
F I G. 13

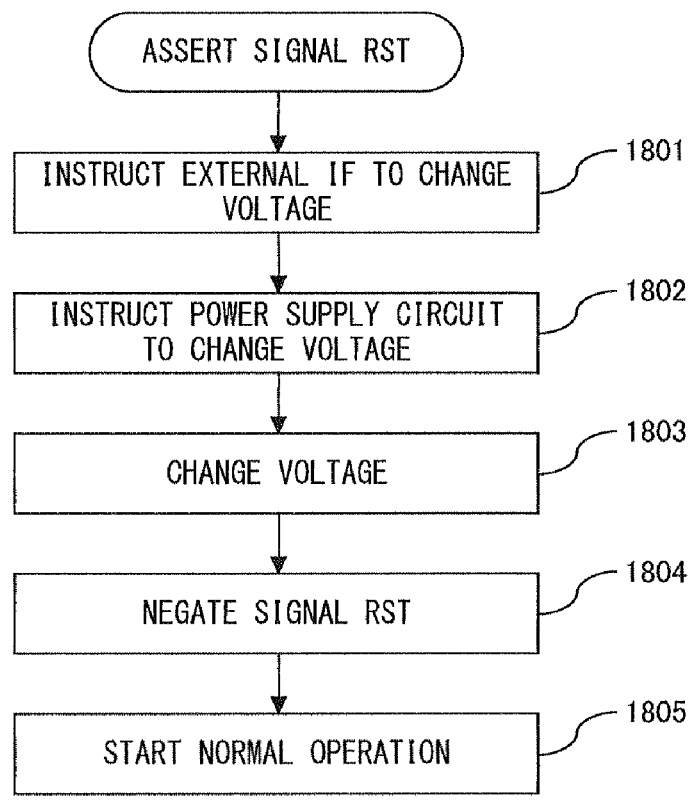
F I G. 18

POWER SUPPLY VOLTAGE ADJUSTING DEVICE

CROSS-REFERENCE TO RELATED APPLICATION

This non-provisional application is a continuation application that claims the benefit of International PCT Application No. PCT/JP2005/017312, which was filed on Sep. 20, 2005, the entire specification, claims and drawings of which are hereby incorporated herewith by reference in its entirety as if fully set forth herein.

BACKGROUND

1. Field

The present invention relates to a power supply voltage adjusting device that adjusts the power supply voltage of a circuit depending on the process variance in the production process of a semiconductor integrated circuit such as a large scale integration (LSI) etc. and the temperature change during operation.

2. Description of the Related Art

With the widespread use of semiconductor integrated circuits of minimal dimensions in processing, process variances have caused signal delay time to each element and leakage current variances to each element. Therefore, when a predetermined power supply voltage is provided regardless of the variance of the element characteristic of a semiconductor integrated circuit, and if an element delay is shifted to a value larger than a designed value, then there are an increasing number of semiconductor integrated circuits that cannot satisfy a target operation frequency. If an element delay is shifted to a value smaller than a designed value, then a leakage current of an element is increased, thereby increasing the power consumption.

To reduce power consumption with high speed processing in solving the above-mentioned problems, Multi-Vth design is commonly used. In the Multi-Vth design, a plurality of cell libraries configured by transistors of different threshold voltages Vth are used.

For example, when two types of cell libraries, that is, a High-Vth transistor having a high Vth and a Low-Vth transistor having a low Vth, are used, a cell library configured by a High-Vth transistor operating with less leakage current at a low operation speed is used for a portion for which an adequate path delay time is allowed for a target operation frequency. On the other hand, a cell library configured by a Low-Vth transistor operating with more leakage current at a high operation speed is used for a portion for which there is no adequate path delay time allowed. Thus, the amount of leakage current passing through the entire circuit can be reduced.

Some techniques relating to adjustment of the power supply voltage of a circuit are proposed. One technique is that replica of a critical path is used to control a power supply voltage. The power supply control is performed depending on whether or not the delay of the critical path satisfies a target operation frequency based on the process variance.

Another technique is that a configuration in which, with a view to stably writing and erasing data for a non-volatile memory circuit, a first counter for counting the oscillation frequency of an internal oscillator and a second counter for counting a clock provided externally or a clock derived therefrom are provided and their count values are used so that a correct pulse width can be formed despite process variances for a write pulse and an erase pulse.

Another technique is that a circuit having a frequency generator for providing a clock signal having a frequency changing based in an operation voltage and a fixed frequency generator, also having a counter for counting the respective frequencies, thereby adjusting the power supply voltage by comparing the count values. It also discloses a configuration of adjusting a power supply voltage with the process variance taken into account by comparing the phase with a claim generated inside using a critical path network corresponding to the replica of a critical path.

However, in an LSI with a Multi-Vth design, the ratio between High-Vth cells and Low-Vth cells is different for each path, and each path has a different amount in change of allowed delay required to satisfy a target frequency for the operation condition such as a process variance, a power supply voltage, a temperature, etc. Therefore, there is more than one critical path to be considered in controlling the supply of the minimal voltage for an operation at a target frequency depending on the process variance.

For example, assume that there are a path A containing most of the cells as Low-Vth cells and a path B containing most of the cells as High-Vth cells, and there also are a first condition on which a delay of a High-Vth cell is shifted to a higher level and a delay of a Low-Vth cell is shifted to a higher level, and a second condition on which a delay of a High-Vth cell is shifted to a higher level and a delay of a Low-Vth cell is shifted to a lower level.

In this case, although the path A is a critical path in an LSI produced as biased on the first condition, there is the possibility that the path B is a critical path in an LSI produced as biased on the second condition.

SUMMARY

In an aspect of the present invention, the power supply voltage adjusting device includes a plurality of oscillators, a counter, a converter, and a controller, and adjusts the power supply voltage of the semiconductor integrated circuit configured by plural types of transistors having different threshold voltages.

The plurality of oscillators are configured by the respective types of transistors in the above-mentioned plural types of transistors. The counter counts the respective oscillation frequencies of these oscillators, and outputs count values. The converter converts the count values of the oscillation frequencies of the oscillators into a power supply voltage value to be set. The controller outputs a control signal indicating the power supply voltage value to be set.

BRIEF DESCRIPTION OF THE DRAWINGS

FIG. 4 is a first conversion table for conversion of an oscillation frequency code into a process variance code;

FIG. 5 is a conversion table for conversion of a process variance code into a voltage code;

FIG. 6 shows the correspondence between a voltage code and a set voltage;

FIG. 7 is a second conversion table for conversion of an oscillation frequency code into a process variance code;

FIG. 13 shows the dependence of a count value on a process variance;

FIG. 18 is a flowchart of an operation of changing a voltage using a held voltage value when a power-on reset is performed;

DESCRIPTION OF THE PREFERRED EMBODIMENTS

The best mode for embodying the present invention is described below in details with reference to the attached drawings.

Generally, the process variance of a semiconductor integrated circuit can be classified into four groups, that is inter-lot variances, inter-wafer variances, inter-chip variances, and intra-chip variances. In the following embodiments, a power supply voltage adjusting device capable of counteracting mainly the inter-lot variances, the inter-wafer variances, and the inter-chip variances. Additionally, a configuration capable of counteracting the intra-chip variances is described.

The first power supply voltage adjusting device includes oscillators for respective transistor types for designating the process variances of respective transistor types used in the Multi-Vth design; a counter for counting the number of oscillations of the oscillators based on an external clock; and a converter having a conversion characteristic obtained by checking all paths in the circuit by, for example, an STA (static timing analysis) for converting count values of the counter into a low voltage value in an operable range at a target operation frequency depending on the process variance of a circuit.

Figure 1:
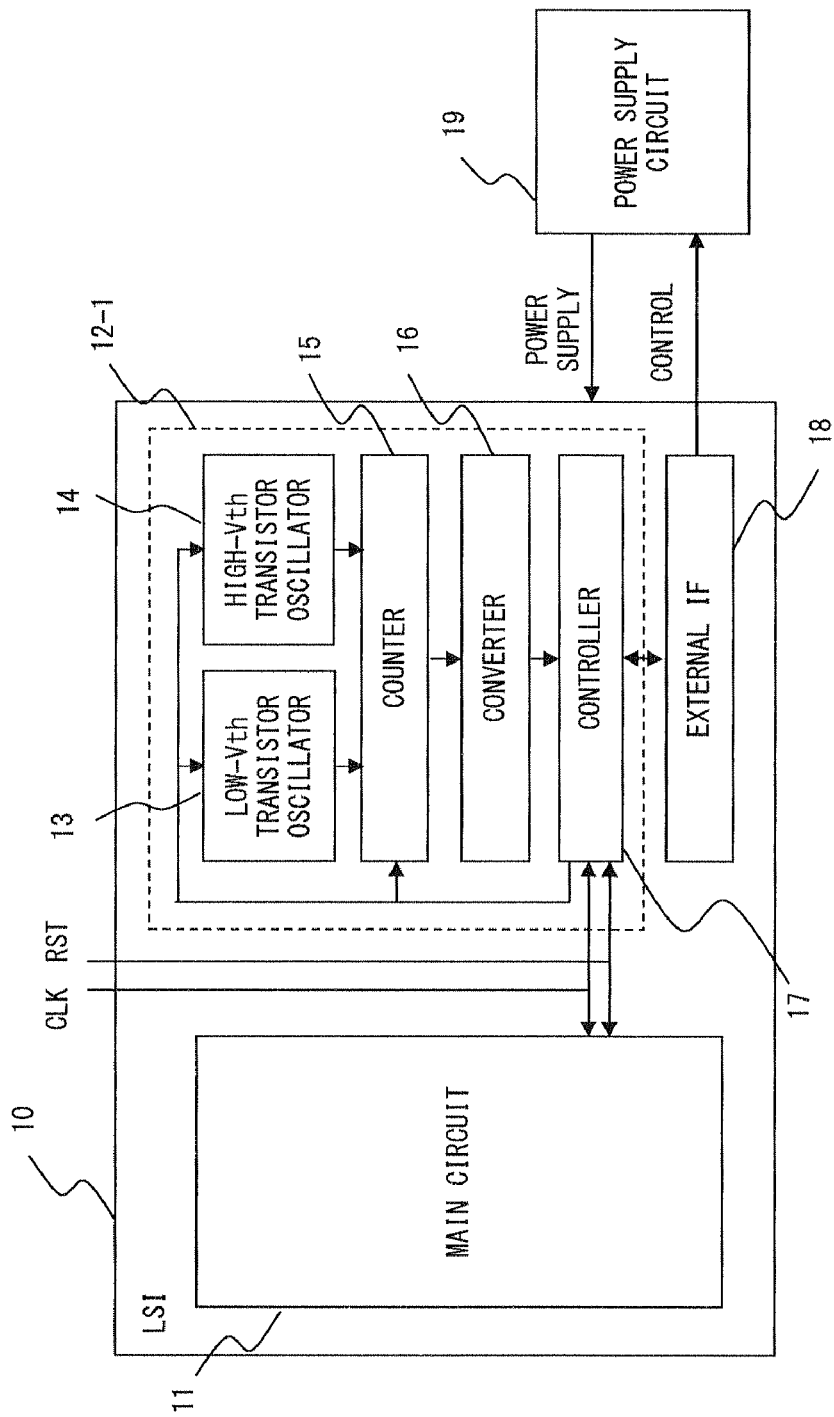
FIG. 1 shows the configuration of an LSI chip having the first power supply voltage adjusting device.

FIG. 1 shows the configuration of an LSI chip to which the first power supply voltage adjusting device is applied. An LSI 10 includes a main circuit 11 in a Multi-Vth design, a power supply voltage adjusting device 12-1, and an external interface 18. The power supply voltage adjusting device 12-1 includes a Low-Vth transistor oscillator 13, a High-Vth transistor oscillator 14, a counter 15, a converter 16, and a controller 17. The main circuit 11 can be, for example, a processor core, an image processing circuit, etc.

In this example, it is assumed that two types of cell libraries are used in the Multi-Vth design, and each library is configured by a Low-Vth PMOS (positive-channel Metal-Oxide semiconductor) transistor and a Low-Vth NMOS (negative-channel metal-oxide semiconductor), or a High-Vth PMOS transistor and a High-Vth NMOS transistor.

The Low-Vth transistor oscillator 13 is configured by the same type of Low-Vth transistor as the main circuit 11, and the High-Vth transistor oscillator 14 is configured by the same type of High-Vth transistor as the main circuit 11.

The counter 15 keeps count of the oscillations output by the oscillators 13 and 14. The converter 16 converts the count value of the counter 15 into a desired power supply voltage. The controller 17 controls the start and stop of the oscillations of the oscillators 13 and 14, the start and stop of the count by the counter 15, and the operation of the external interface 18.

The external interface 18 transfers the information received from the controller 17 to a power supply circuit 19. The power supply circuit 19 is an integrated circuit (IC) for providing a power supply for the LSI 10, and adjusts a power supply voltage depending on the information received from the external interface 18.

The operation is described below. The controller 17 transmits an oscillation start signal to the Low-Vth transistor oscillator 13 and the High-Vth transistor oscillator 14 to identify the process variance of the LSI 10 including the main circuit 11 for each type of transistor. Upon receipt of the oscillation start signal, the oscillators 13 and 14 starts oscillation, and transmit the oscillation output to the counter 15. Upon receipt of a count start signal from the controller 17, the counter 15 starts its operation, and starts a counting operation depending on the oscillation frequencies of the oscillators 13 and 14.

After plural cycles of the external clock signal CLK input to the LSI 10 or an internal clock signal generated based on the CLK have passed, the controller 17 requests the counter 15 to stop counting. Since a signal of a specific frequency regulated by the operation specification of the LSI 10 for example is input as the external clock signal CLK, the frequency of the external clock signal CLK is designated.

Therefore, based on the frequency, the process variance (inter-lot variances, inter-wafer variances, and inter-chip variances) of the LSI 10 including the main circuit 11 can be identified from the count values of the counter 15 depending on the oscillation frequency of the oscillators 13 and 14. A reset signal RST is described later.

Figure 2:
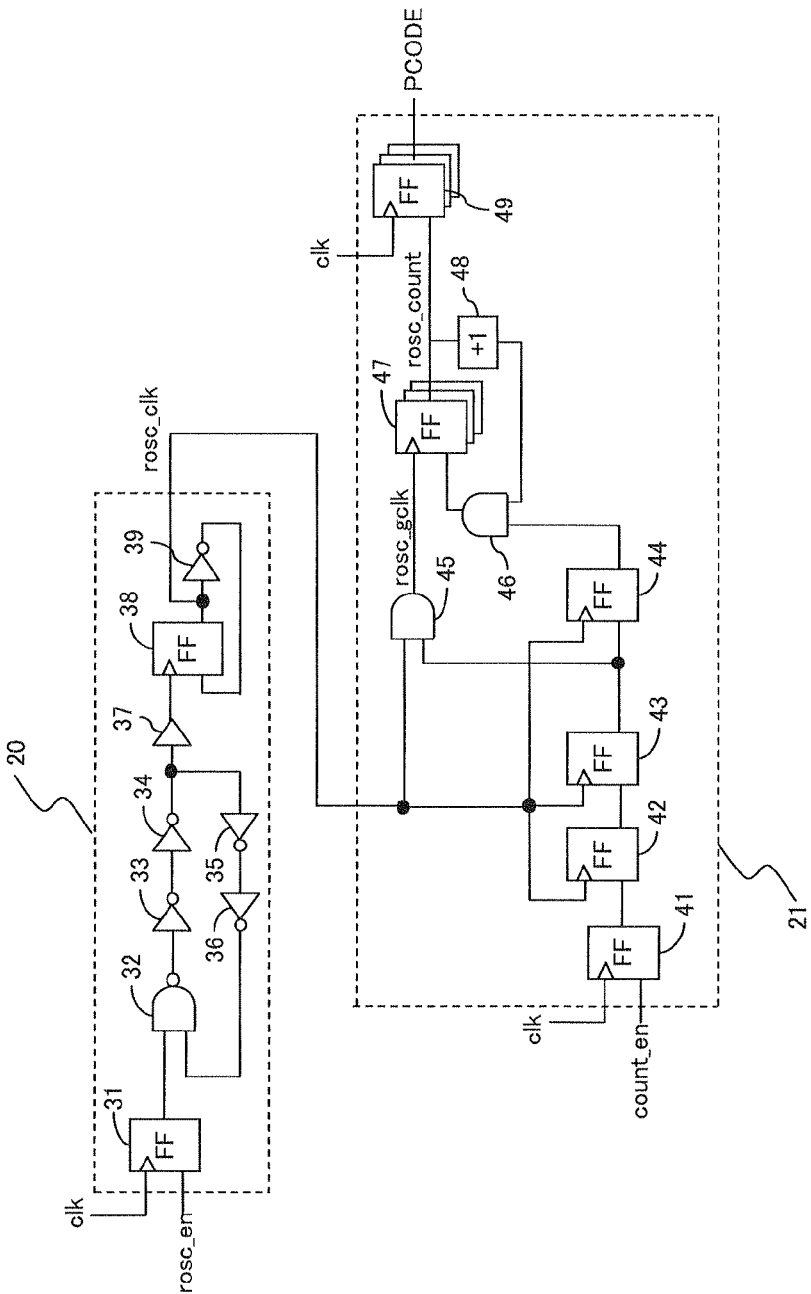
FIG. 2 shows a schematic circuit diagram of an oscillator and a counter.

FIG. 2 shows an example of a circuit used in the power supply voltage adjusting device 12-1 shown in FIG. 1. An oscillation circuit 20 corresponds to the Low-Vth transistor oscillator 13 shown in FIG. 1, and a counter circuit 21 corresponds to the circuit in the counter 15 for counting the number of oscillations of the oscillator. Input signals clk, rosc_en, and count_en are provided by the controller 17. The clock signal clk can be an external clock signal CLK, or an internal clock signal generated based on the CLK.

The oscillation circuit 20 is configured by flip-flip (FF) circuits 31 and 38, a NAND circuit 32, inverters 33 through 36 and 39, and a buffer 37, and outputs a signal rosc_clk. Among the circuits, the NAND circuit 32 and the inverters 33 through 36 configure a ring oscillator, and the FF circuit 38 and the inverter 39 configure a ½ frequency divider.

A Low-Vth transistor is used as an element of the ring oscillator, and the process variance of the Low-Vth transistor is reflected by the frequency of the signal rosc_clk. The ring oscillator oscillates while the signal rosc_en indicates the logic "1". The oscillation frequency is determined by the delay time of each element forming part of the ring oscillator.

The counter circuit 21 is configured by the FF circuits 41 through 44, 47, and 49, AND circuits 45 and 46, and an incrementer 48, and outputs a signal PCODE. The circuit counts the number of toggles of the signal rosc_clk while the signal count_en indicates the logic "1" in the plural cycles of the clock signal clk. Since an asynchronous transfer of signals is required between the FF circuit driven by the signal clk and the FF circuit driven by the signal rosc_clk, a meta-stable countermeasure circuit including the FF circuits 41 through 44 and a gated clock buffer including the AND circuit 45 are provided.

Figure 3:
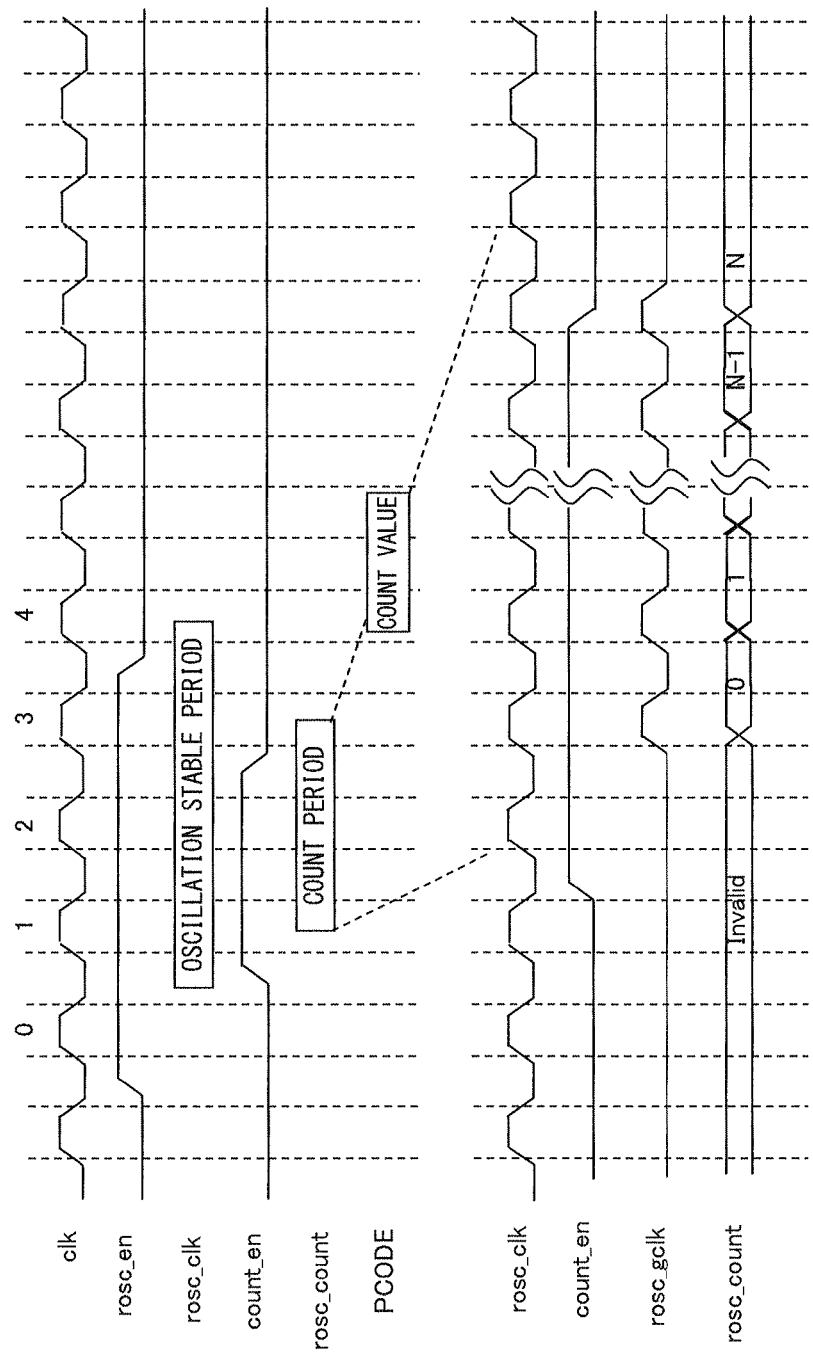
FIG. 3 shows the operation waveform of an oscillator and a counter.

FIG. 3 shows an operation waveform of the circuit shown in FIG. 2. In FIG. 3, the clock signal clk and the clock signal rosc_clk are asynchronous, and the cycles of the clocks are different from each other. The cycle of the clock signal rosc_clk is determined by the delay characteristic of the ring oscillator.

When the signal rosc_en is asserted, the ring oscillator starts its oscillation, and the signal rosc_clk starts toggling. Next, when the signal count_en is asserted, the gated clock signal rosc_gclk starts toggling, and the number of toggles is counted by the FF circuit 47 and the incrementer 48. The count value appears as the output signal rosc_count of the FF circuit 47, held by the FF circuit 49, and output as a signal PCODE.

Since the signal clk and the signal rosc_clk are asynchronous clock signals in this example, the signal rosc_en and the signal count_en are separately provided so that the asynchronous transfer cannot be an undesired effect on the timing of the start/stop of the oscillation and the timing of the start/stop of the counting.

When the signal count_en is negated, the clock signal rosc_gclk stops toggling, and the FF circuit 47 stops counting. At this time, the value N of the signal PCODE indicates the number of oscillations of the Low-Vth transistor oscillator 13.

FIG. 2 shows the oscillation circuit 20 and the counter circuit 21 for the Low-Vth transistor oscillator 13. The oscillation circuit and the counter circuit for the High-Vth transistor oscillator 14 are similarly configured. In this case, the ring oscillator of the oscillation circuit 20 is configured by a High-Vth transistor. Thus, the counter 15 outputs the count values of the number of oscillations of the oscillators 13 and 14 as an oscillation frequency code to the converter 16.

The converter 16 converts the oscillation frequency code received from the counter 15 into a low voltage value in an operable range of the main circuit 11.

The converter 16 can temporarily convert, for example, an oscillation frequency code into a corresponding process variance value, and then into a voltage value corresponding to the process variance value. In this case, the converter 16 converts the oscillation frequency code using conversion tables, for example, as shown in FIGS. 4 and 5.

The conversion table shown in FIG. 4 inputs a 14-bit oscillation frequency code [13:0], and outputs a 6-bit process variance code [5:0]. In the oscillation frequency code [13:0], the oscillation frequency code [13:7] indicates a count value of the Low-Vth transistor oscillator 13, and the oscillation frequency code [6:0] indicates a count value of the High-Vth transistor oscillator 14. In the process variance code [5:0], the process variance code [5:3] indicates a result of the conversion of the oscillation frequency code [13:7], and the process variance code [2:0] indicates a result of the conversion of the oscillation frequency code [6:0].

In this example, the maximum value of the count value of the counter 15 is 127, and the process variance value is classified into 8 categories, that is, 0 through 7. The correspondence between the oscillation frequency code and the process variance code can be obtained by performing a simulation in advance by a circuit simulator such as a SPICE (simulation program with integrated circuit emphasis) etc.

The conversion table shown in FIG. 5 inputs a process variance code [5:0] and outputs a 4-bit voltage code [3:0]. The correspondence between the process variance code and the voltage code can be obtained by acquiring the delay information about the LSI 10 after analyzing an STA etc. with varied conditions of a process variance, a temperature, and a power supply voltage, etc.

FIG. 6 shows the correspondence between a voltage code and an actually set voltage. In this example, 16 voltage codes are used with the minimum voltage set to 1.000[V] and the maximum voltage set to 1.375[V], but the number of voltage codes can be increased or decreased as necessary.

The controller 17 receives a voltage code converted by the converter 16, and instructs the external interface 18 to transmit the voltage code to the power supply circuit 19. The external interface 18 transmits a control signal for adjustment of the power supply voltage to the power supply circuit 19. The power supply circuit 19 receives the control signal from the external interface 18, and sets the power supply voltage of the LSI 10 to a predetermined value corresponding to the control signal.

Thus, the power supply voltage of the LSI 10 in the Multi-Vth design can be set to a low voltage value in an operable range of the main circuit 11 depending on the process variance of the LSI 10, thereby realizing low power consumption and operation at a high speed.

In the circuit shown in FIG. 1, two types of cell libraries are used, each of the cell library is configured by a Low-Vth PMOS transistor and a Low-Vth NMOS transistor, or a High-Vth PMOS transistor and a High-Vth NMOS transistor. However, it is not necessary that the number of the cell libraries is two. That is, three or more cell libraries can be used. For example, when three types of cell libraries are used, the third oscillator is added to the power supply voltage adjusting device 12-1 to attain a similar effect.

The second power supply voltage adjusting device is based on the power supply voltage adjusting device 12-1 shown in FIG. 1, has the function of inputting to the converter 16 a signal indicating the temperature when the oscillators 13 and 14 are operated. The converter 16 converts the count value of the counter into a voltage value using the input temperature signal.

FIG. 7 shows the conversion tables of the converter 16 used by the second power supply voltage adjusting device. The temperature of the LSI 10 has an effect of the operation situation and the ambient temperature, and the oscillation frequencies of the oscillators 13 and 14 change by the effect of the temperature. Therefore, the conversion table holds the correspondence between the oscillation frequency code and the process variance code for each temperature at which the oscillators 13 and 14 are operated.

Figure 8:
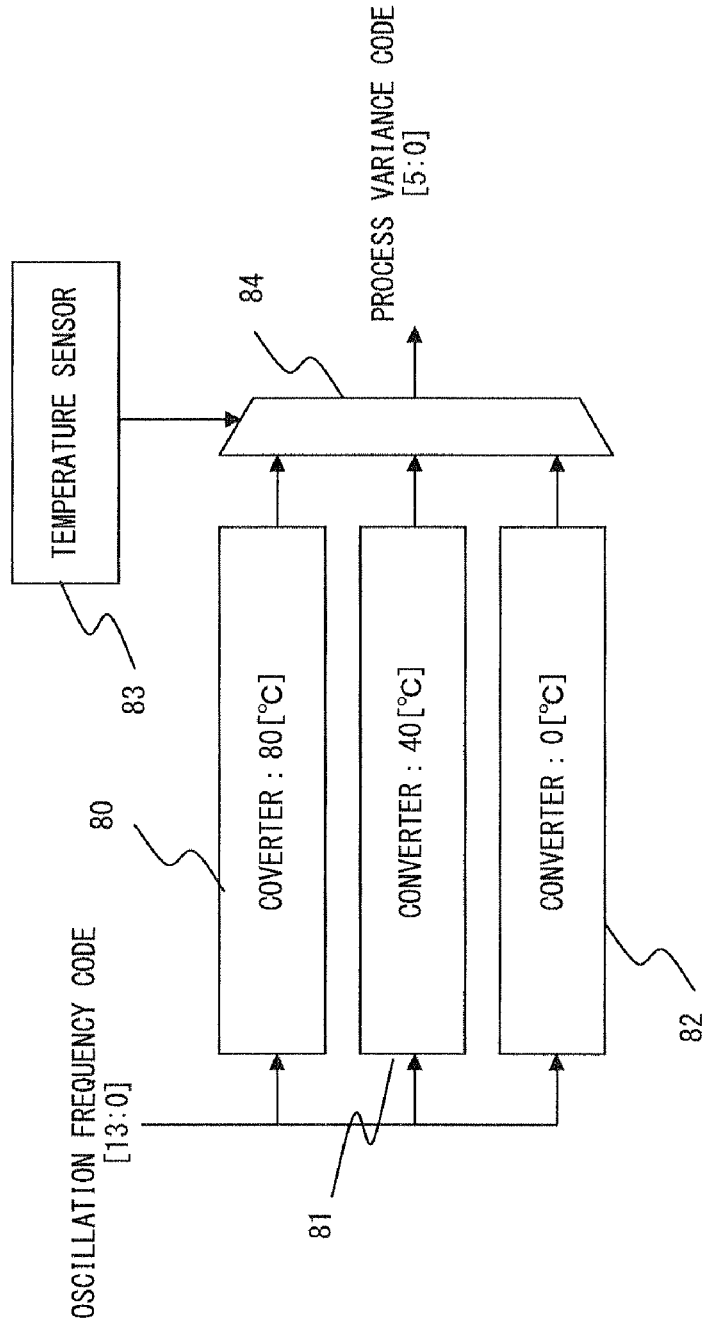
FIG. 8 shows the configuration of a converter.

FIG. 8 shows an example of the configuration of the converter 16. Converters 80, 81, and 82 convert an oscillation frequency code into a process variance code based on the conversion tables at the temperatures of 80° C., 40° C., and 0° C. respectively. A temperature sensor 83 measures the ambient temperature of the oscillator and outputs a temperature signal, and a selector 84 selects and outputs one of the output signals of the converters 80 through 82 according to the output from the temperature sensor 83.

Thus, the operation temperatures of the oscillators 13 and 14 are measured by the temperature sensor 83, and the conversion table is switched depending on the measured temperature, thereby identifying the process variance with high accuracy. As a result, the margin of the set power supply voltage can be reduced, and lower power consumption can be realized.

In the examples shown in FIGS. 7 and 8, three degrees of temperatures are used, but the temperature range can be classified in more details. Although the output signal of the temperature sensor 83 is used as a signal for switching the output of the converters 80 through 82, the switch can be performed in other methods. For example, a temperature mode signal can be provided as a fixed value from an external device to the LSI 10.

The third power supply voltage adjusting device is configured such that the conversion information of the converter 16 can be rewritten by a program of a microprocessor core by reading the count value of the counter 15 from the main circuit 11 of the LSI 10, for example, the microprocessor etc.

Figure 9:
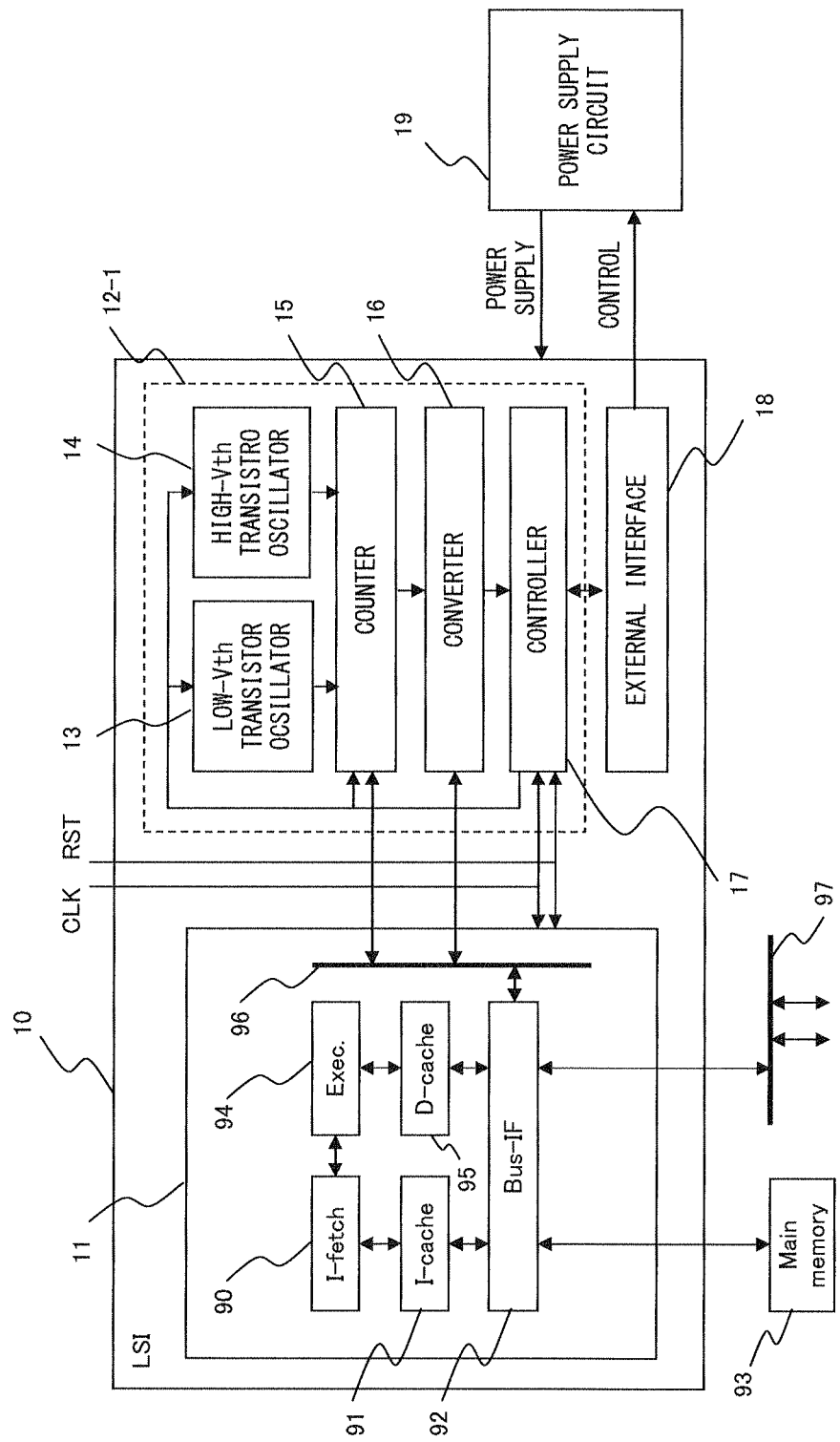
FIG. 9 shows the configuration of an LSI chip having the third power supply voltage adjusting device.

FIG. 9 shows the configuration of the LSI chip to which the third power supply voltage adjusting device is applied. In FIG. 9, the same reference numeral as in FIG. 1 is assigned to the same component, and the main circuit 11 corresponding to the microprocessor includes an instruction fetch unit 90, an instruction cache unit 91, a bus interface unit 92, an execution unit 94, a data cache unit 95, and an internal data bus 96.

The bus interface unit 92 controls the access to the internal data bus 96, the 97 and the main memory 93 for storing a program and data. The execution unit 94 performs decoding an instruction, an arithmetic operation, etc. The data cache unit 95 processes a load/store instruction and accesses data.

The counter 15 and the converter 16 is configured such that they can be connected to the internal data bus 96, and data can be read and written from the program of the microprocessor 11. The rewrite of the conversion table of the converter 16 can be performed in, for example, the following procedure.
1. A number of actual LSIs are tested, the count value of the counter of each LSI and the necessary minimum voltage for the operation by each LSI at a target frequency are measured, and the correspondence is obtained.
2. The obtained correspondence data is incorporated into the program of the microprocessor 11.
3. The microprocessor 11 writes the incorporated correspondence data to the internal storage (memory, register, etc.) by executing the program. The write of the correspondence is normally performed when the operation of the LSI 10 is started.

Thus, since the conversion information about the converter 16 can be rewritten after producing the LSI 10, the error etc. between the library used when the LSI 10 is designed and the actual circuit is considered and the power supply voltage is adjusted, thereby realizing lower power consumption and operation at a high speed.

Furthermore, the power supply voltage can be adjusted without rewriting conversion information. In this case, the program of the microprocessor 11 reads the count value of the counter 15, and the execution unit 94 obtains a count value using the correspondence data incorporated into the program. The bus interface unit 92 transmits an obtained voltage value to the power supply circuit 19 through the power supply voltage adjusting device 12-1 and the external interface 18, and realizes the adjustment of the voltage.

The fourth power supply voltage adjusting device can read a count value of the counter 15 from a device external to the LSI 10, and the device can rewrite the conversion information about the converter 16.

Figure 10:
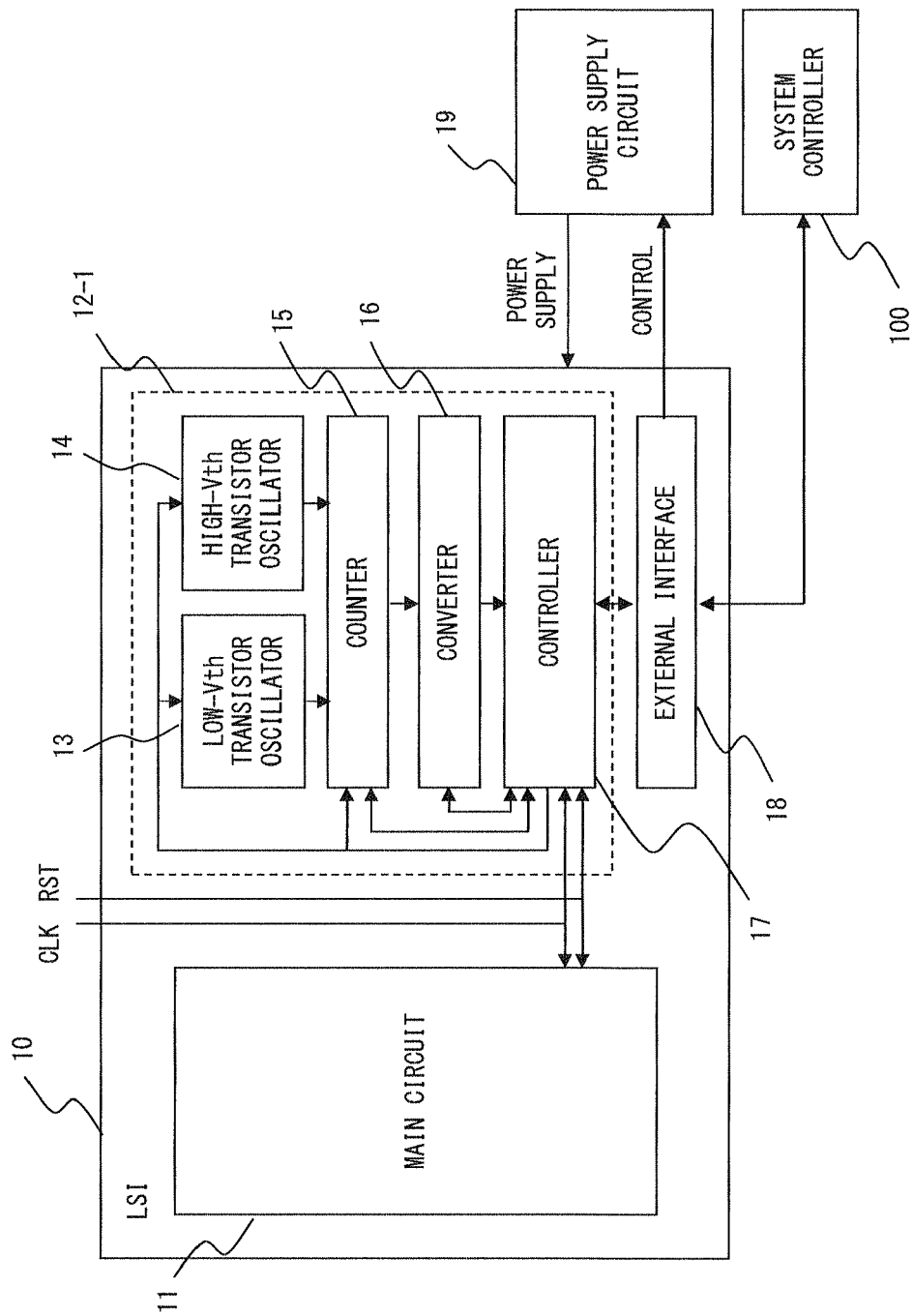
FIG. 10 shows the configuration of an LSI chip having the fourth power supply voltage adjusting device.

FIG. 10 shows the configuration of the LSI chip to which the fourth power supply voltage adjusting device is applied. In FIG. 10, the same reference numeral as in FIG. 1 indicates the same component as in FIG. 1.

As in the program of the microprocessor 11 shown in FIG. 9, the correspondence data between a count value acquired in advance and a voltage is incorporated into the program of a system controller 100 provided outside the LSI 10. The system controller 100 executes the program, and then writes the correspondence data to the internal storage of the converter 16 through the external interface 18.

A power supply voltage can also be adjusted without rewriting the conversion information. In this case, the program of the system controller 100 transmits a read request of the count value of the counter 15 to the external interface 18. The external interface 18 transmits the read request to the controller 17, the counter 15 returns the count value to the controller 17, and the controller 17 transmits the count value to the system controller 100 through the external interface 18.

The system controller 100 obtains a voltage value using the correspondence data incorporated into the program, and transmits the obtained voltage value to the power supply circuit 19 through the external interface 18, thereby realizing the adjustment of the voltage.

With the above-mentioned power supply voltage adjusting device, the conversion information about the converter 16 can be rewritten after producing the LSI 10 although the LSI 10 is an ASIC (application specific integrated circuit) etc. without a microprocessor core. Therefore, by considering the error etc. between a library used when the LSI 10 is designed and an actual circuit, a power supply voltage can be adjusted, thereby realizing lower power consumption and operation at a high speed.

The fifth power supply voltage adjusting device transfers a count value of the counter 15 to the power supply device for supplying a power supply voltage to the LSI 10, and the power supply device calculates a necessary voltage value by the internal converter or program, and provides the power supply of the voltage for the LSI 10.

Figure 11:
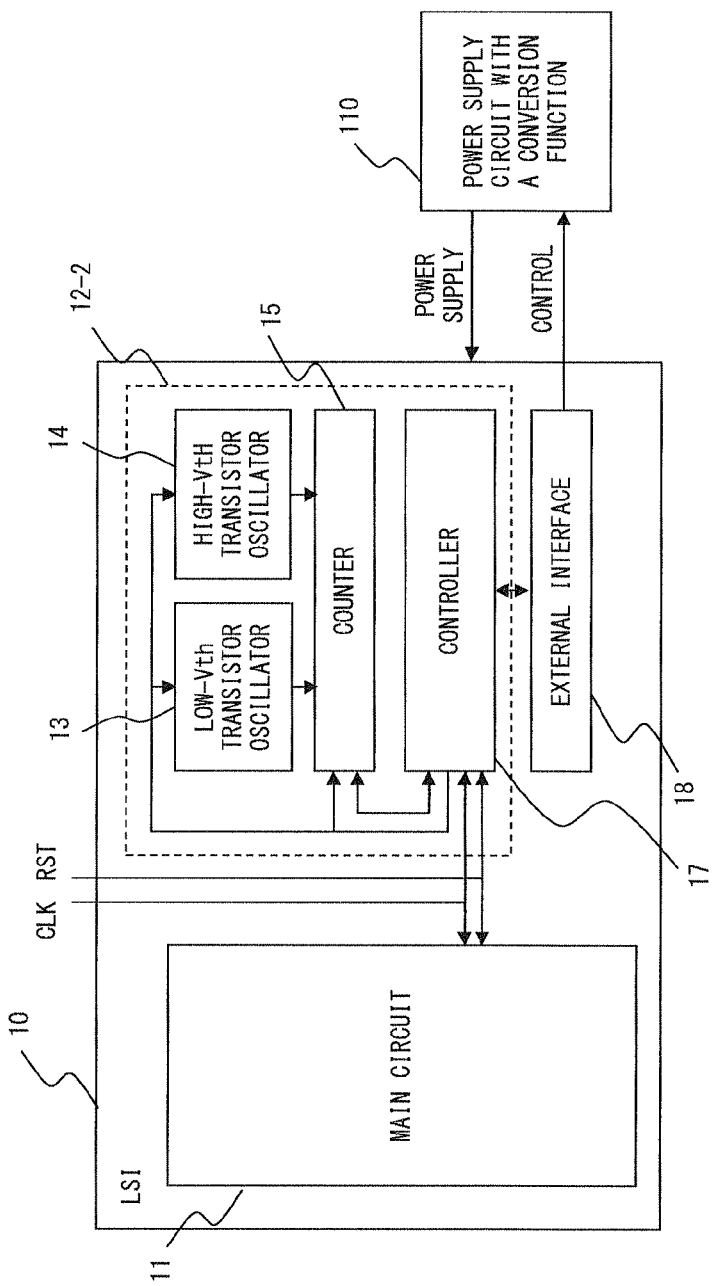
FIG. 11 shows the configuration of an LSI chip having the fifth power supply voltage adjusting device.

FIG. 11 shows the configuration of the LSI chip to which the fifth power supply voltage adjusting device is applied. In FIG. 11, the same reference numeral as in FIG. 1 indicates the same component as in FIG. 1, and a power supply voltage 110 with a conversion function has the function of converting a count value of the counter 15 into a voltage value.

The operation is described below. The Low-Vth transistor oscillator 13, the High-Vth transistor oscillator 14, the counter 15, and the controller 17 of the power supply voltage adjusting device 12-2, and the external interface 18 function almost the same way as the circuit shown in FIG. 1. However, the controller 17 transmits a count value of the counter 15 to the power supply voltage 110 with a conversion function through the external interface 18. The power supply voltage 110 with a conversion function converts a received count value into a low voltage value in an operable range of the LSI 10 at a target operation frequency, and provides the voltage for the LSI 10.

According to the power supply voltage adjusting device, the converter 16 is not necessary in the LSI 10, and the area of the circuit of the LSI 10 is deleted, and although the main circuit 11 is a circuit having no arithmetic function as a processor etc., a power supply voltage can be controlled depending on the process variance. Therefore, low power consumption and high-speed operation can be realized.

In addition, since a power supply circuit directly reads a count value and obtains a power supply voltage to be set, a power supply voltage can be adjusted without a process load on the system controller 100 as in the configuration shown in FIG. 10. Therefore, the throughput of the system is not degraded.

The power supply voltage 110 with a conversion function can be a system controller having a converting function and a separated power supply circuit. In this case, the external interface 18 transmits a count value of the counter 15 to the system controller, and the system controller converts the received count value into a voltage value, and transmits a set instruction of the voltage to the power supply circuit. The power supply circuit provides the voltage for the LSI 10.

The sixth power supply voltage adjusting device is configured such that a count value of the counter 15 can be read from a device external to the LSI 10. For example, when a test is conducted after producing the LSI 10, the test is performed at a specific temperature and a power supply voltage, the count value is read, the process variance of the LSI 10 is specified from the read count value, and a low voltage value in an operable range of the LSI 10 is calculated by an LSI test program etc. The voltage value is recorded on a non-volatile memory element, and a power supply voltage is adjusted to the value.

Figure 12:
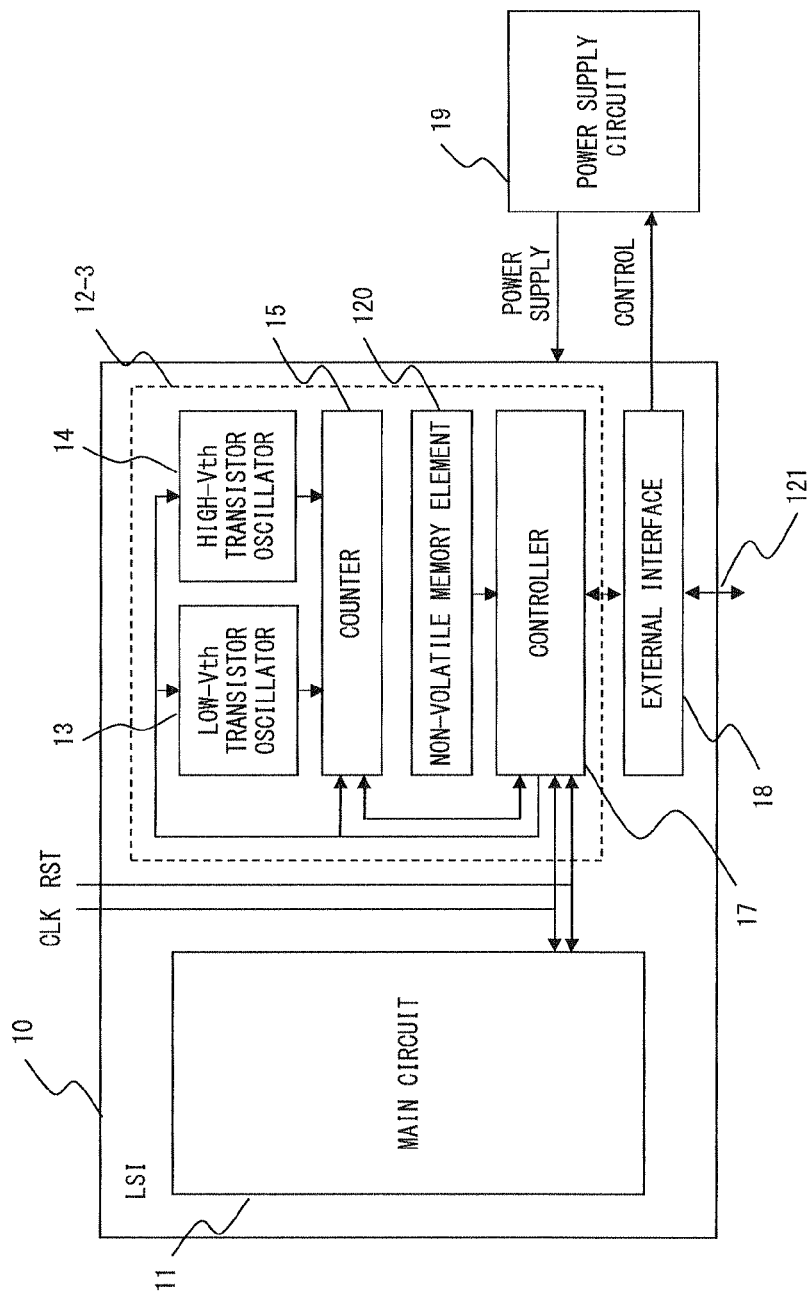
FIG. 12 shows the configuration of an LSI chip having the sixth power supply voltage adjusting device.

FIG. 12 shows the configuration of an LSI chip to which the sixth power supply voltage adjusting device is applied. The power supply voltage adjusting device 12-3 is provided with a non-volatile memory element 120 in place of the converter 16, and the 10 is provided with a test terminal 121.

The operation is described below. When the LSI 10 is tested, the power supply voltage adjusting device 12-3 operates in the same way as the power supply voltage adjusting device 12-1, and designates the process variance of the LSI 10 including the microprocessor 11 from the count value of the counter 15. The controller 17 receives the count value of the counter 15, and outputs it to the test terminal 121 through the external interface 18. At this time, the process variance of the LSI 10 can be designated with high accuracy by conducting the test at a specific power supply voltage and temperature.

The non-volatile memory element 120 can be configured by a fuse, flash memory, etc., and holds a voltage code corresponding to a necessary power supply voltage to operate at a target operation frequency depending on the process variance of the LSI 10. For example, when the non-volatile memory element 120 is configured by a fuse, a specific voltage code to be set for the fuse is designated from the count value read from the test terminal 121 when the test is conducted, the fuse is cut by a laser device etc., and the voltage code is held in the fuse.

During the operation of the LSI 10, the controller 17 transmits the voltage code held by the non-volatile memory element 120 to the power supply circuit 19 through the external interface 18, and the power supply circuit 19 provides a corresponding power supply voltage to the LSI 10.

Thus, at the specific power supply voltage and temperature set with high accuracy, the oscillation frequencies of the oscillators 13 and 14 can be counted, and the process variance of the LSI 10 can be identified with higher accuracy. Therefore, the margin of the set power supply voltage can be reduced, and low power consumption and high-speed operation can be realized. Since a necessary voltage value is stored in the oscillation circuit 20, the converter 16 is not required, and the area of a circuit can be reduced.

In FIG. 12, the test terminal 121 is provided independent of other terminals, but it can be shared with a terminal of a control signal between the external interface 18 and the power supply circuit 19.

A method of designating a voltage code to be set for the non-volatile memory element 120 can be the following two methods.

(1) First Method

Using the design data of the LSI 10, a circuit simulation etc. obtains a count value of the counter 15 depending on the process variance at the temperature and the power supply voltage. In addition, an STA etc. obtains a necessary minimum voltage required for the LSI 10 to operate at a target frequency with respect to each process variance value, and designates a voltage code based on the correspondence.

In this method, first in the circuit simulation, the dependence on the process variance of a count value is acquired at a specific temperature (for example, 125° C.) and power supply voltage (for example, 1.2V).

FIG. 13 shows an example of the dependence on the process variance of the count value of the Low-Vth transistor oscillator 13 under the condition of the temperature of 125° C. and the voltage of 1.2V. The vertical axis indicates a count value, and a horizontal axis indicates a process variance.

Next, when an LSI is tested, the test is conducted at the same temperature and voltage as the circuit simulation, and the count value C of the counter 15 is read from the test terminal 121. Then, using the above-mentioned dependence, the process variance value P corresponding to the count value C is designated. With respect to the High-Vth transistor oscillator 14, the process variance value corresponding to the read count value is similarly designated.

Then, the STA acquires the process variance of the Low-Vth transistor and the process variance of the High-Vth transistor at a target operation frequency and the maximum temperature (for example, 125° C.) at which the operation of the LSI 10 can be guaranteed, and the process variance of the LSI 10 and the operation characteristic for the power supply voltage using the power supply voltage as the parameter.

Figure 14:
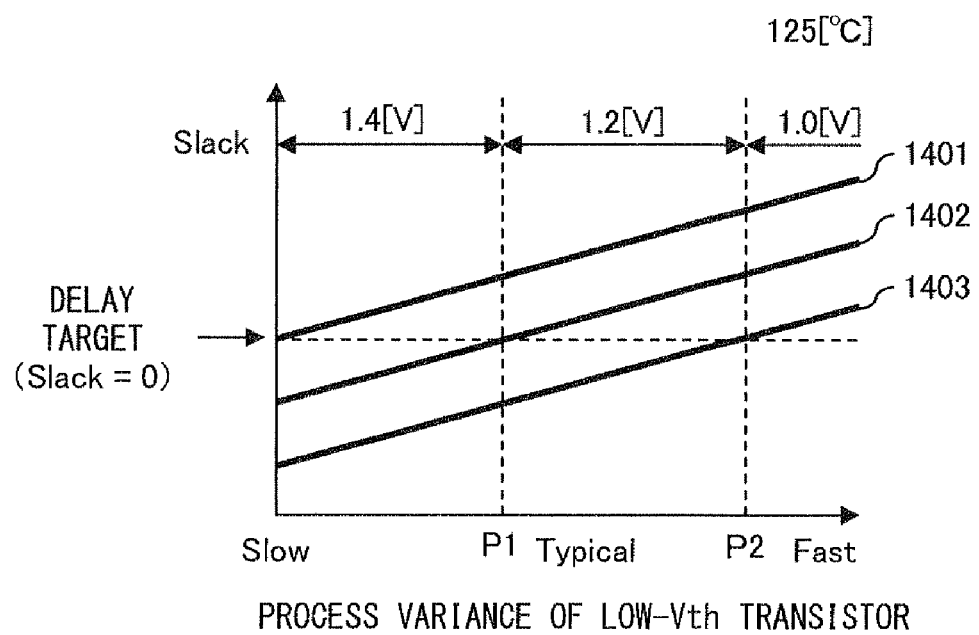
FIG. 14 shows the operation characteristic of an LSI.

FIG. 14 shows an example of the operation characteristic of the LSI 10 at the temperature of 125° C. The vertical axis indicates the slack value as allowed delay of the LSI 10, and the horizontal axis indicates the process variance of the Low-Vth transistor. Straight lines 1401, 1402, and 1403 indicate the operation characteristic when the power supply voltage is 1.4V, 1.2V, and 1.0V. The graph is obtained for a plurality of process variance values of the High-Vth transistor.

When Slack=0, the target operation frequency is realized. When Slack<0, it falls in timing error, the minimum voltage satisfying the timing condition is 1.4 V in the area in which the process variance value of the Low-Vth transistor is P1 or less. In the area of P1 through P2, the minimum voltage is 1.2 V, and the minimum voltage is 1.0 V in the area of P2 or more.

Figure 15:
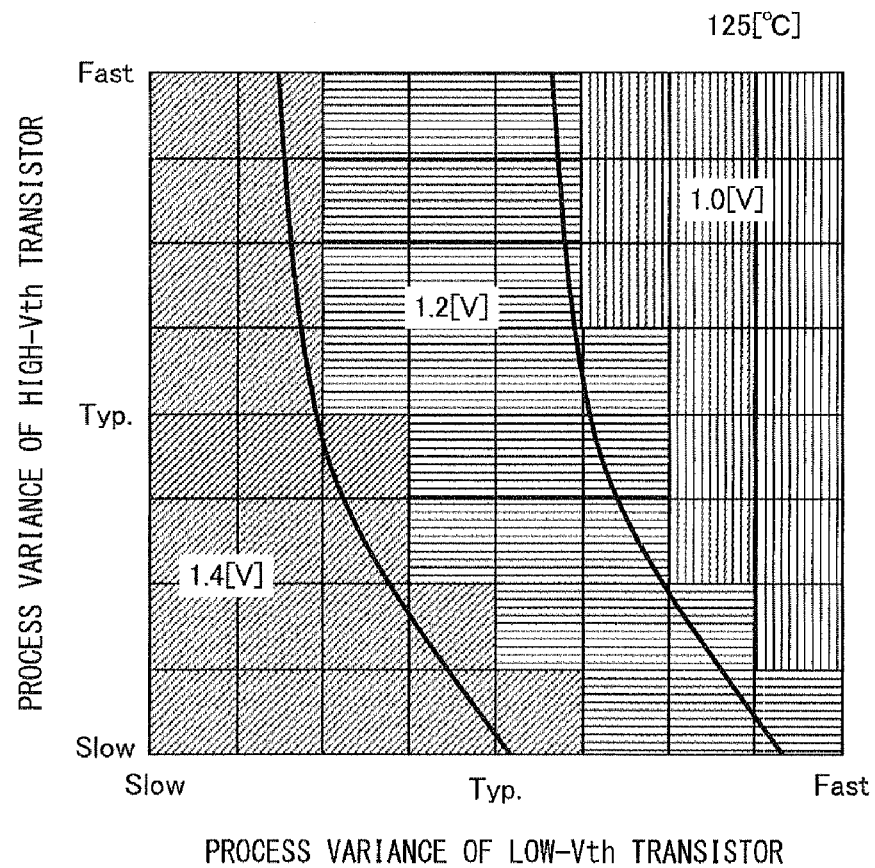
FIG. 15 shows the relationship between a process variance and a minimum voltage.

According to the above-mentioned graphs, the minimum voltage for Slack=0 is obtained for each value of the process variance of the High-Vth transistor and the process variance of the Low-Vth transistor as shown in FIG. 15.

Using the process variance value designated when an LSI is tested and the information at the minimum voltage, the minimum voltage required for the LSI 10 to operation at a target operation frequency is obtained, and a voltage code to be set is designated.

With respect to each of a plurality of process variance values of the Low-Vth transistor, a graph in which the horizontal axis shown in FIG. 14 is replaced with the process variance of the High-Vth transistor, and the information about the minimum voltage shown in FIG. 15 can be obtained from the graphs.

(2) Second Method

Tests are conducted on a number of actual LSIs 10, and the count value of the counter 15 of each LSI 10 and the minimum voltage required for the LSI 10 to operate at a target frequency are measured, the correspondence is acquired, and the a voltage code is designated based on the correspondence.

In this method, the correspondence between the count value of the counter 15 of each LSI 10 and the voltage value at which each LSI 10 is operated is acquired in the tests of a large number of LSIs 10.

For example, when the LSI 10 is tested, the count value of the counter 15 at a specific temperature and voltage is acquired, and the operation test of the microprocessor 11 of the LSI 10 is performed on the condition of the target operation frequency and the maximum temperature in which the operation of the LSI 10 is guaranteed. At this time, the power supply voltage at which the LSI 10 is normally operated is obtained by changing the power supply voltage as a parameter, and the correspondence between the count value and the power supply voltage of the normal operation is obtained.

When a large amount of LSI 10 is produced, the power supply voltage value corresponding to the count value of the counter 15 is obtained using the correspondence acquired in the test, and a voltage code to be set is designated.

The seventh power supply voltage adjusting device adjusts a power supply voltage when a power-on reset is performed before the microprocessor 11 of the LSI 10 starts its operation. Since the power supply voltage adjusting device is configured similarly with any of the power supply voltage adjusting devices 12-1 to 12-3, it is hereinafter described as a power supply voltage adjusting device 12.

Figure 16:
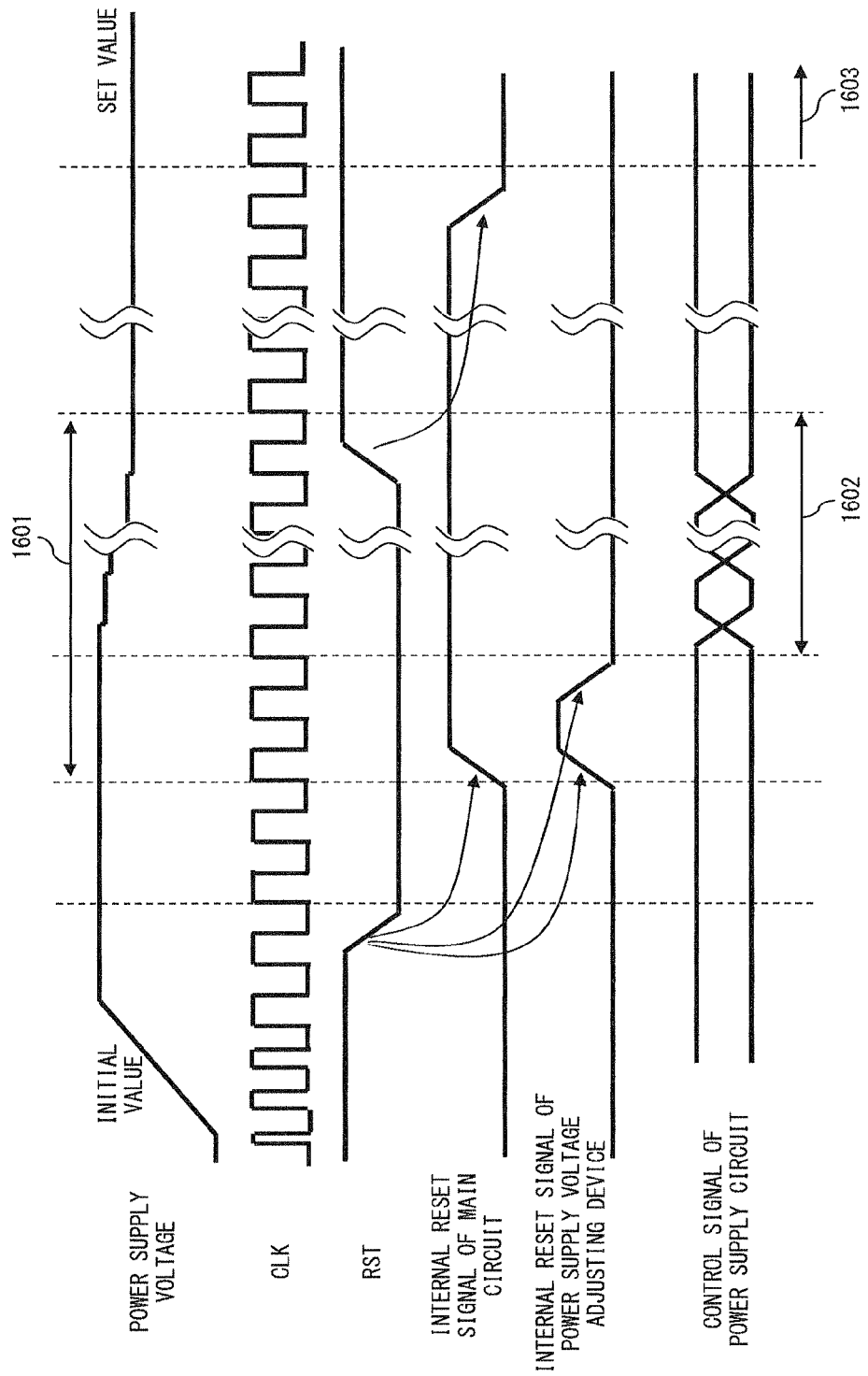
FIG. 16 is a timing chart when a power-on reset is performed on an LSI.

FIG. 16 is a timing chart of a LSI chip, when a power-on reset is performed, to which the seventh power supply voltage adjusting device is applied. A period 1601 shown in FIG. 16 indicates a reset expanding period of the microprocessor 11 for setting a power supply voltage. A period 1602 indicates a power supply voltage setting period. A period 1603 indicates a user logic normal operation period after the microprocessor 11 starts its operation.

After the power supply voltage is supplied to the LSI 10, the power supply voltage is set as an initial value. In this example, the initial value of the power supply voltage is the maximum value of an adjustable voltage range, but the minimum voltage or an intermediate voltage can be acceptable so far as the power supply voltage adjusting device 12 can operate.

When the power supply voltage and the clock signal CLK are stable, the reset signal RST (negative logic) is asserted. Thus, the internal reset signal (positive logic) of the microprocessor 11 and the internal reset signal (positive logic) of the power supply voltage adjusting device 12 are asserted. When the power supply voltage adjusting device 12 is completely reset, the internal reset signal is negated, but the reset signal of the microprocessor 11 is kept asserted. The controller 17 generates the internal reset signal of the power supply voltage adjusting device 12 using the falling edge of the reset signal RST.

The power supply voltage adjusting device 12 starts a series of operations during the reset of the microprocessor 11, transmits a voltage code to the power supply circuit 19 or the power supply voltage 110 with a conversion function, and the power supply circuit 19 or the power supply voltage 110 with a conversion function provides a predetermined voltage for the LSI 10. When the reset signal RST is negated, the internal reset signal of the microprocessor 11 is released, and the microprocessor 11 starts its operation.

If the power supply voltage is not adjusted when a power-on reset is performed, and the main circuit 11 is adjusted after it starts the operation, a predetermined voltage is supplied before adjusting the voltage although the LSI 10 has an element delay shifted toward a higher leakage current, thereby causing high power consumption. Therefore, there is the possibility that a low heat-resistant and more expensive package is required. On the other hand, if the LSI 10 has an element delay shifted toward a lower leakage current, the operable frequency becomes lower. Therefore, there is the possibility that the operation cannot be performed if a predetermined voltage is supplied.

On the other hand, if the power supply voltage is adjusted when a power-on reset is performed before starting the operation of the main circuit 11, then the power supply voltage can be adjusted with low power consumption by the main circuit 11. As a result, a high heat resistant and less expensive LSI package is available.

However, if the problem can be solved by setting the initial value of the power supply voltage to an intermediate voltage, then it is not necessary to adjust the power supply voltage when a power-on reset is performed.

Figure 17:
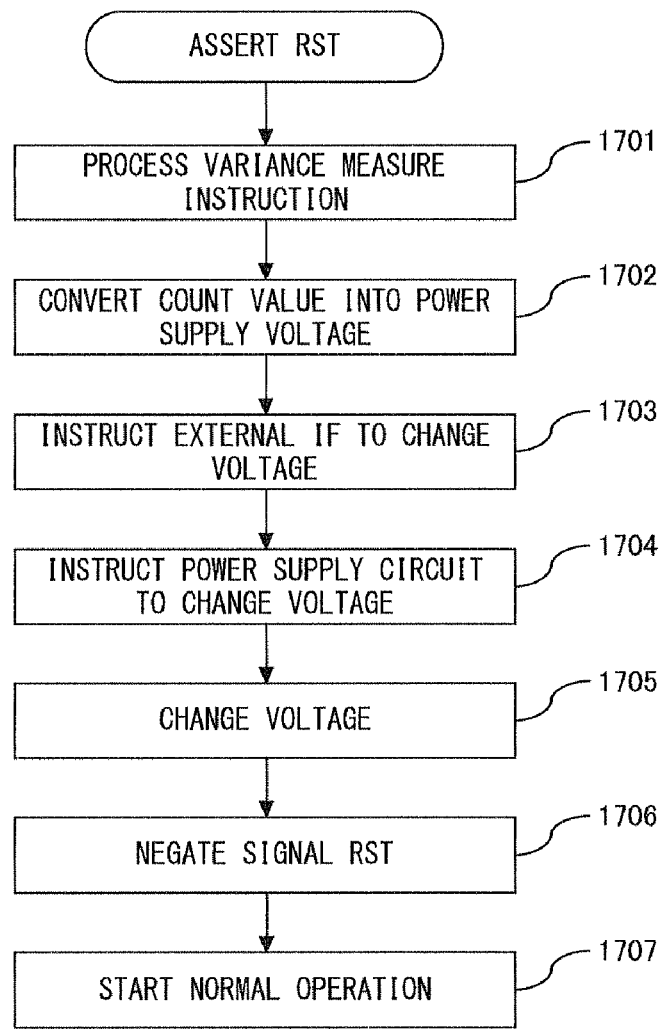
FIG. 17 is a flowchart of an operation of measuring a process variance and changing a voltage when a power-on reset is performed.

FIG. 17 is a flowchart of the operation when the timing shown in FIG. 16 is applied to the power supply voltage adjusting device 12-1. If the signal RST is asserted, then the internal reset signal of the main circuit 11 is asserted, and the controller 17 asserts the signals rosc_en and count_en, and instructs the oscillators 13 and 14, and the counter 15 to measure the process variance (step 1701).

Next, the converter 16 converts the count value measured by the counter 15 into a power supply voltage to be set (step 1702), and the controller 17 instructs the external interface 18 to change the voltage (step 1703). Then, the external interface 18 instructs the power supply circuit 19 to change the voltage (step 1704), and the power supply circuit 19 changes the voltage to a specified value (step 1705).

When the signal RST is negated (step 1706), the internal reset signal of the main circuit 11 is negated, and the main circuit 11 starts a normal operation based on the user logic (step 1707).

The operation performed when the timing shown in FIG. 16 is applied to the power supply voltage adjusting device 12-2 shown in FIG. 11 is basically similar to the operation shown in FIG. 17.

FIG. 18 is a flowchart of the operation performed when the timing shown in FIG. 16 is applied to the power supply voltage adjusting device 12-3. When the signal RST is asserted, the internal reset signal of the main circuit 11 is asserted, and the controller 17 instructs the external interface 18 to transfer the voltage value held in the non-volatile memory element 120 and change the voltage (step 1801).

The operations of the subsequent steps 1802 through 1805 are the same as the operations in steps 1704 through 1707 shown in FIG. 17.

The eighth power supply voltage adjusting device is provided with a non-volatile memory element for holding the power supply voltage information corresponding to the count value of the counter 15 when the main circuit 11 satisfies a target operation frequency under the condition of a specific process variance, a specific temperature, and a specific power supply voltage. Then, the value held in the non-volatile memory element is compared with the count value of the counter 15 measured during the operation of the main circuit 11, the power supply voltage is lowered if the measured count value is higher than the held value, and increased if it is lower.

Figure 19:
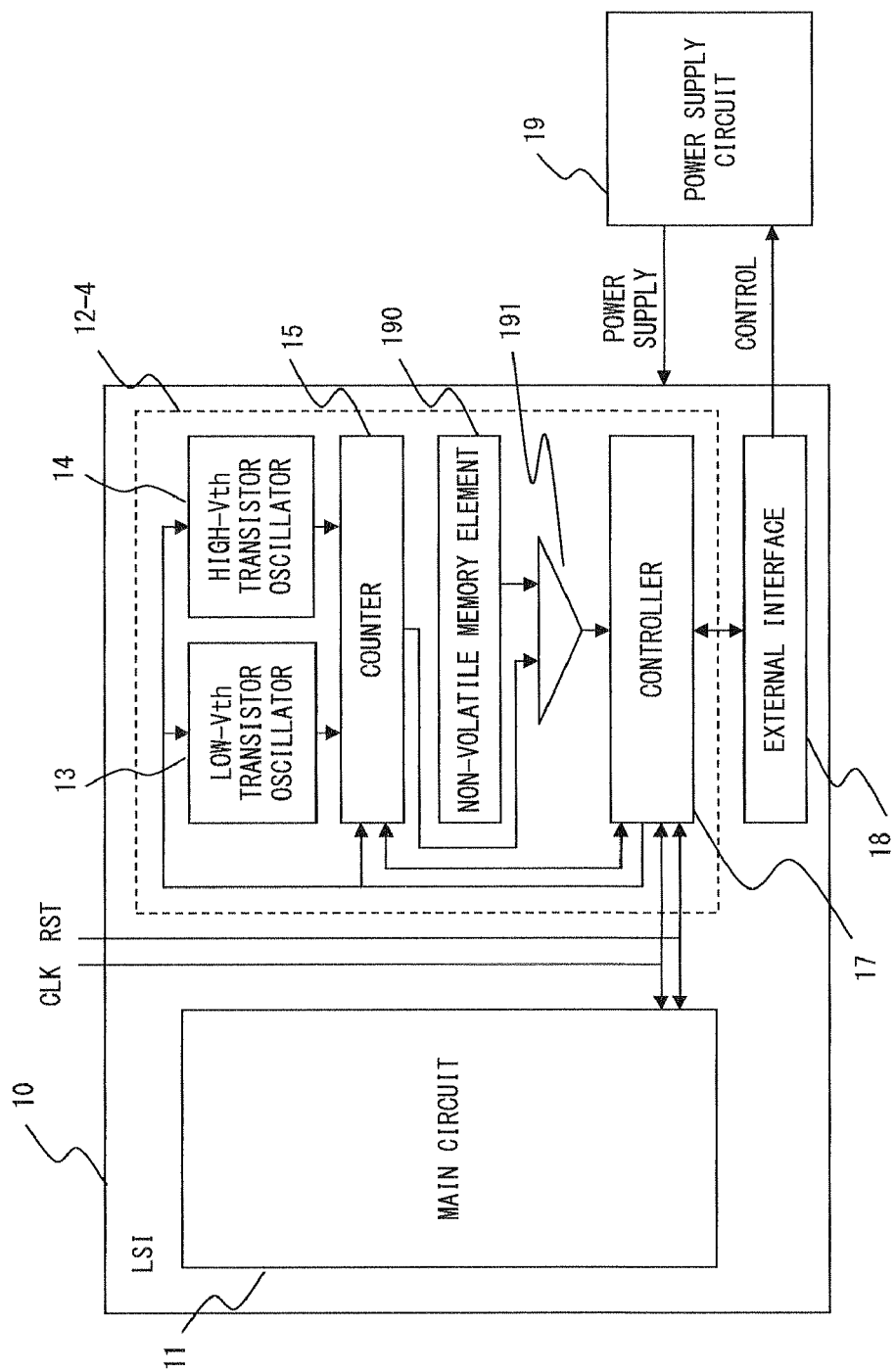
FIG. 19 shows the configuration of an LSI chip having an eighth power supply voltage adjusting device.

FIG. 19 shows the configuration of the LSI chip to which the eighth power supply voltage adjusting device is applied. In FIG. 19, the same reference numeral as shown in FIG. 1 indicates the same component. The power supply voltage adjusting device 12-4 is provided with a non-volatile memory element 190 and a comparator 191 in place of the converter 16. The non-volatile memory element 190 holds a value corresponding to the count value of the counter 15, and the comparator 191 compares the count value measured when the LSI 10 is operated with the value stored in the non-volatile memory element 190.

The operation is described below. When the LSI 10 is tested, the operation performed until the count value of the counter 15 is read to an external device of the LSI 10 through the external interface 18 to designate the process variance of the LSI 10 is similar to the case shown in FIG. 12. With the configuration shown in FIG. 19, the reading test terminal is also used as a terminal of the control signal between the external interface 18 and the power supply circuit 19. By reading the count value of the counter 15, the process variance P_0 of the LSI 10 is designated.

For example, as with the above-mentioned first method, the count value of the counter 15 is obtained depending on various process variances at the temperature of the test and power supply voltage in a circuit simulation etc. using the design data of the LSI 10. Using the data, the process variance can be designated from the count value of the counter 15 measured during the test.

Next, a value set in the non-volatile memory element 190 is obtained. When the process variance P_0 of the LSI 10 is designated, the temperature T and the power supply voltage V can be appropriate selected to allow the LSI 10 to operate at the target operation frequency F_0. For example, the necessary power supply voltage V_0 when the temperature is set to T_0=125° C. can be obtained from a result of an STA or the LSI test.

Next, the count value C_0 of the counter 15 with the process variance P_0, the temperature T_0, and the power supply voltage V_0 is obtained from the result of the circuit simulation or the LSI test. Thus, the obtained count value C_0 is set in the non-volatile memory element 190.

Then, to operate the LSI 10, the controller 17 transmits an oscillation start signal to the Low-Vth transistor oscillator 13 or the High-Vth transistor oscillator 14 during the operation of the LSI 10, and transmits a count start signal to the counter 15. Then, a count stop signal is transmitted to the counter 15. The comparator 191 compares the count value output from the counter 15 with the value set in the non-volatile memory element 190, and outputs a result of the comparison to the controller 17.

When a received comparison result indicates that the count value is higher than a set value, the controller 17 transmits a signal specifying a voltage value lower than the current voltage value to the external interface 18. If the comparison result indicates that the compared valued are equal to each other, the current voltage value is held. If the comparison result indicates that the count value is lower than the set value, then a signal specifying a voltage value higher than the current voltage value is transmitted to the external interface 18.

Thus, depending on the operation situation of the main circuit 11 of the LSI 10, and considering the effect of the power supply voltage reduced by a fluctuating temperature and a signal IR-drop, the operation of the LSI 10 at a target operation frequency F_0 is guaranteed, and the power supply voltage can be dynamically adjusted such that the power consumption can be reduced. Therefore, when the operation rate of the main circuit 11 is low and the temperature is also low, and the IR-Drop of the power supply voltage is low, the power supply voltage can be reduced, and low power consumption can be realized.

This adjusting method is based on that the dependence on the temperature of the oscillation frequency and power supply voltage of the Low-Vth transistor oscillator 13 or the High-Vth transistor oscillator 14 is similar to the dependence on the temperature of the operable operation frequency of the LSI 10. Then, the correlation in dependence can be acquired from the measurement result from the STA, the circuit simulation, or the LSI test, and an appropriate margin can be added to control the power supply voltage.

Figure 20:
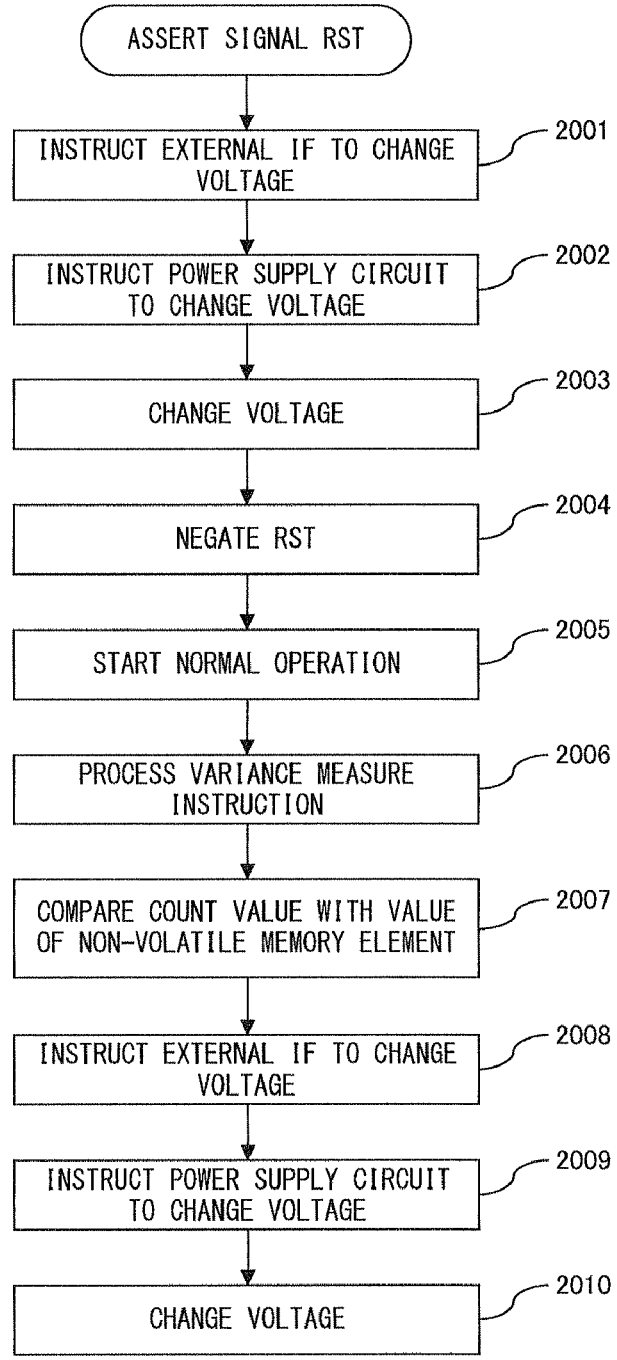
FIG. 20 is a flowchart of an operation of changing a voltage when a power-on reset is performed and in a normal operation.

FIG. 20 is a flowchart of the operation of the power supply voltage adjusting device 12-4 shown in FIG. 19. The operations in steps 2001 through 2005 are similar to the operations in steps 1801 through 1805 shown in FIG. 18.

When the main circuit 11 starts a normal operation, the controller 17 asserts the signals rosc_en and count_en, and instructs the oscillators 13 and 14 and the counter 15 to measure the process variance (step 2006). The comparator 191 compares the count value measured by the counter 15 with the set value of the non-volatile memory element 190 (step 2007), and the controller 17 instructs the external interface 18 to change the voltage depending on the comparison result (step 2008).

Then, the external interface 18 instructs the power supply circuit 19 to change the voltage (step 2009), and the power supply circuit 19 changes the voltage into the specified value (step 2010). Afterwards, the operations in steps 2006 through 2010 are repeated in a predetermined cycle.

The ninth power supply voltage adjusting device is provided with oscillators mounted in a plurality of points in the LSI 10 and the power supply voltage is adjusted by considering the most serious operation conditions although there is the fluctuation of a temperature or power supply voltage from different local operation rates depending on the operation situation of the main circuit 11 of the LSI 10.

Figure 21:
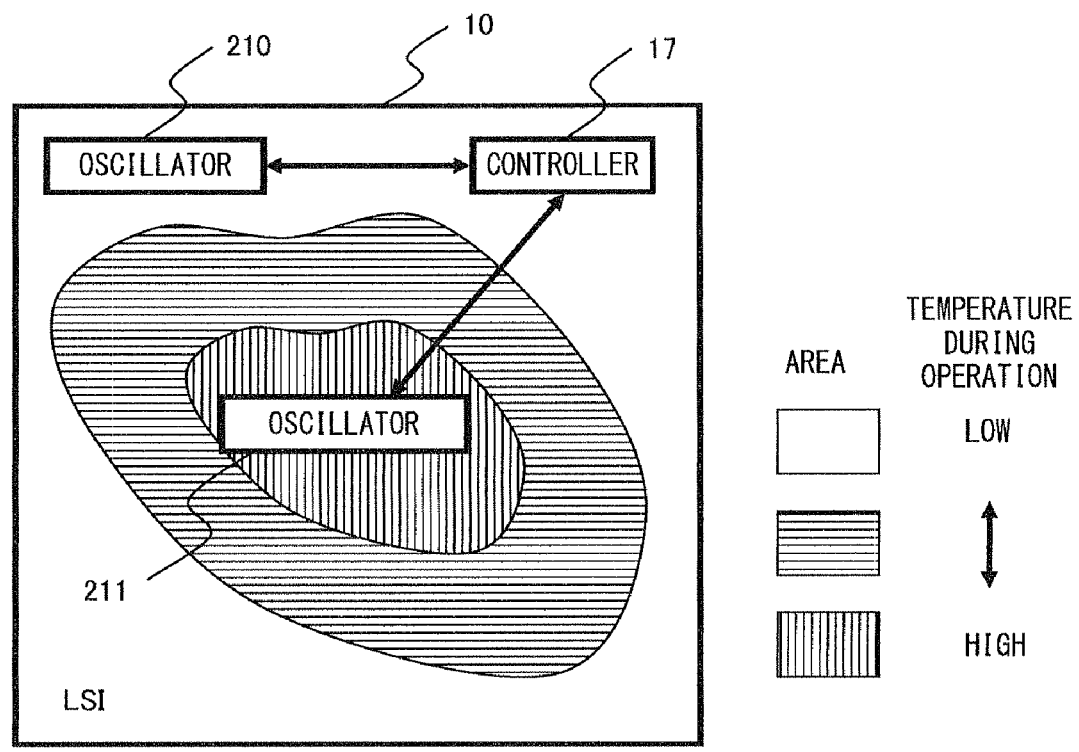
FIG. 21 shows the temperature distribution in an operating LSI and the arrangement of oscillators.

FIG. 21 shows the temperature distribution in the operation in the LSI chip to which the ninth power supply voltage adjusting device is applied and an example of the arrangement of oscillators. Each of oscillators 210 and 211 includes the Low-Vth transistor oscillator 13 and the High-Vth transistor oscillator 14.

Depending on the operation situation of the LSI 10, the temperature distribution during the operation is variable as shown in FIG. 21. Although not shown in the attached drawings, the power supply voltage can fall by the IR-drop, it also fluctuates. Therefore, the temperature and the distribution of the power supply voltage for determination of the operation frequency of the LSI 10 cannot be considered in controlling the power supply voltage only by arranging the oscillator 210 at one point in the LSI 10. Therefore, in this example, another oscillator 211 is arranged in another point in the LSI 10.

In FIG. 21, oscillators are arranged at two points, but more oscillators can be arranged in the LSI 10 of the request in chip size or chip cost is satisfied. The arrangement of the counter 15, the controller 17, etc. is not specified.

The controller 17 determines the power supply voltage to be set using the count value of the oscillation frequency of the oscillator arranged at the point of the most serious operation condition of the oscillators 210 and 211.

With the above-mentioned configuration, the power supply voltage can be appropriately adjusted by considering the distribution of the temperature in the LSI 10 and the power supply voltage, thereby solving the problem of the intra-chip variance of the LSI 10. The distribution of the temperature and the power supply voltage fluctuates depending on the operating state of the LSI 10, but the power supply voltage is adjusted by considering the most serious condition. Therefore, the margin of the power supply voltage to be set can be reduced, and the power consumption can be successfully reduced.

The arrangement of the plurality of oscillators can be applied to any of the first through eighth power supply voltage adjusting devices, but can be most appropriately applied to the eighth power supply voltage adjusting device.

In this case, a plurality of counters 15 for counting the respective oscillation frequencies of the plurality of oscillators are provided in the LSI 10. In the count values of these counters 15, the counter having the smallest value is selected, and input to the comparator 191. Thus, the power supply voltage can be adjusted by considering the most serious operation condition.

As described above, according to the present invention, the power supply voltage of an LSI can be set to a low voltage value in the operable range at a target operation frequency depending on the process variance. Therefore, in the LSI in which an element delay is shifted to a larger delay, the power supply voltage is raised for a high speed operation. In the LSI in which an element delay is shifted to a smaller delay, the power supply voltage is reduced to suppress a leakage current. Therefore, the circuit can be operated in a high speed, and the power consumption can be reduced.

In addition, since a less expensive package with a higher resistance can be used with reduced power consumption, the LSI can be realized at a lower price.

Furthermore, the power supply voltage can be set by considering the temperature fluctuation and the fluctuation of the IR-drop of the power supply voltage during the operation, thereby further reducing the power consumption.

What is claimed is:

1. A power supply voltage adjusting device which adjusts a power supply voltage of a semiconductor integrated circuit configured by plural types of transistors having different threshold voltages, comprising:
    a first ring oscillator to oscillate a first oscillation signal, all of transistors included in the first ring oscillator, which are provided in a ring path of the first ring oscillator and are used for oscillating the first oscillation signal, having a high threshold value;
    a second ring oscillator to oscillate a second oscillation signal, all of transistors included in the second ring oscillator, which are provided in a ring path of the second ring oscillator and are used for oscillating the second oscillation signal, having a low threshold value;
    a first counter to count first oscillation frequency of the first oscillation signal to output a first count value and to count second oscillation frequency of the second oscillation signal to output a second count value;
    a converter to convert the first count value into a first power supply voltage corresponding to the high threshold value and the second count value into a second power supply voltage corresponding to the low threshold value; and
    a controller to output a control signal indicating one of the first power supply voltage and the second power supply voltage.

2. The device according to claim 1, wherein
    the converter includes a temperature sensor for detecting a temperature of the semiconductor integrated circuit, and converts the first count value and the second count value into one of different power supply voltages depending on the detected temperature.

3. The device according to claim 1, wherein
    the first count value and the second count value is read from a circuit in the semiconductor integrated circuit, and conversion information of the converter is rewritten from the circuit in the semiconductor integrated circuit.

4. The device according to claim 1, wherein
    the first count value and the second count value is read from outside of the semiconductor integrated circuit, and conversion information of the converter is rewritten from outside of the semiconductor integrated circuit.

5. A power supply voltage adjusting device which adjusts a power supply voltage of a semiconductor integrated circuit configured by plural types of transistors having different threshold voltages, comprising:
    a first ring oscillator to oscillate a first oscillation signal, all of transistors included in the first ring oscillator, which are provided in a ring path of the first ring oscillator and are used for oscillating the first oscillation signal, having a high threshold value;
    a second ring oscillator to oscillate a second oscillation signal, all of transistors included in the second ring oscillator, which are provided in a ring path of the second ring oscillator and are used for oscillating the second oscillation signal, having a low threshold value;
    a first counter to count first oscillation frequency of the first oscillation signal to output a first count value and to count second oscillation frequency of the second oscillation signal to output a second count value;
    a converter to convert the first count value into a first power supply voltage corresponding to the high threshold value and the second count value into a second power supply voltage corresponding to the low threshold value; and
    a controller to output a control signal indicating one of the first power supply voltage and the second power supply voltage,
    wherein a power supply device for providing a power supply for the semiconductor integrated circuit sets a power supply voltage depending on the output control signal.

6. The device according to claim 1, wherein
    the first counter counts the oscillation frequencies of the first ring oscillator and the second ring oscillator when a power-on reset is performed on the semiconductor integrated circuit, and the controller outputs the control signal when the power-on reset is performed.

7. A power supply voltage adjusting device which adjusts a power supply voltage of a semiconductor integrated circuit configured by plural types of transistors having different threshold voltages, comprising:
    a first ring oscillator to oscillate a first oscillation signal, all of transistors included in the first ring oscillator, which are provided in a ring path of the first ring oscillator and are used for oscillating the first oscillation signal, having a high threshold value;
    a second ring oscillator to oscillate a second oscillation signal, all of transistors included in the second ring oscillator, which are provided in a ring path of the second ring oscillator and are used for oscillating the second oscillation signal, having a low threshold value;
    a first counter to count first oscillation frequency of the first oscillation signal to output a first count value and to count second oscillation frequency of the second oscillation signal to output a second count value;
    a memory element to hold power supply voltage information determined depending on the first count value and the second count value; and
    a controller to read the power supply voltage information from the memory element and outputting a control signal indicating the read power supply voltage information.

8. The device according to claim 7, wherein
    the controller reads the power supply voltage information from the memory element and outputs the control signal when a power-on reset is performed on the semiconductor integrated circuit.

9. The device according to claim 7, further comprising
    a comparator to compare one of the first count value and the second count value with power supply voltage information held in the memory element, wherein
    the controller outputs a control signal indicating increase or decrease of the power supply voltage depending on a comparison result.

10. The device according to claim 9, further comprising
a third oscillator to oscillate a third oscillation signal arranged in different area from the first ring oscillator and the second ring oscillator;
a fourth oscillator to oscillate a fourth oscillation signal arranged in the different area; and
a second counter to count third oscillation frequency of the third oscillation signal to output a third count value and to count fourth oscillation frequency of the fourth oscillation signal to output a fourth count value;
wherein the comparator compares one of the first count value, the second count value, the third count value and the fourth count value with the power supply voltage information held in the memory element.

* * * * *